(12) United States Patent
Yamada et al.

(10) Patent No.: US 8,237,469 B2
(45) Date of Patent: Aug. 7, 2012

(54) SEMICONDUCTOR DEVICE AND METHOD OF CONTROLLING THE SAME

(75) Inventors: Toshio Yamada, Kawasaki (JP); Kazuo Tanaka, Kawasaki (JP); Akinobu Watanabe, Kawasaki (JP); Shigeru Yamamoto, Kokubunji (JP); Yukio Hiraiwa, Kokubunji (JP)

(73) Assignee: Renesas Electronics Corporation, kanagawa (JP)

( * ) Notice: Subject to any disclaimer, the term of this patent is extended or adjusted under 35 U.S.C. 154(b) by 0 days.

(21) Appl. No.: 12/871,529

(22) Filed: Aug. 30, 2010

(65) Prior Publication Data

US 2011/0062990 A1    Mar. 17, 2011

(30) Foreign Application Priority Data

Sep. 14, 2009   (JP) ................................. 2009-211910

(51) Int. Cl.
*H03K 19/094* (2006.01)
(52) U.S. Cl. .......................................... 326/83; 326/87
(58) Field of Classification Search .................. 326/104, 326/114, 112, 119, 125, 82–87
See application file for complete search history.

(56) References Cited

U.S. PATENT DOCUMENTS 4,888,498 A * 12/1989 Kadakia ......................... 327/546
5,986,473 A * 11/1999 Krishnamurthy et al. ...... 326/83

FOREIGN PATENT DOCUMENTS

JP        2008-21733        1/2008

* cited by examiner

*Primary Examiner* — Shawki S Ismail
*Assistant Examiner* — Thienvu Tran
(74) *Attorney, Agent, or Firm* — Womble Carlyle

(57) ABSTRACT

A pull-up circuit prevents generation of a leak current if a difference of potentials occurs between a power source voltage of a pull-up circuit (a bus-hold circuit) and an input terminal. A control terminal is provided in the bus-hold circuit. Inputs of the input terminal and the control terminal are input to a NOR gate, and an output of the NOR gate is input to a gate terminal of a first MOSFET that controls coupling between an input terminal and the power source voltage of the bus-hold circuit. A second MOSFET ("control" MOSFET) is provided as a switch that operates by an inverted output of the control terminal. By coupling the first MOSFET and the control MOSFET in series, the coupling between the input terminal and the power source voltage is controlled with a higher precision, thereby preventing generation of a leak current.

20 Claims, 10 Drawing Sheets

| CNT | IN | OUT | MOSFET12 | MOSFET13 |
|---|---|---|---|---|
| H | H | L | On | Off |
| | L | L | On | Off |
| L | H | L | On | On |
| | L | H | Off | On |

SEMICONDUCTOR DEVICE AND METHOD OF CONTROLLING THE SAME

CROSS-REFERENCE TO RELATED APPLICATION

The disclosure of Japanese Patent Application No. 2009-211910 filed on Sep. 14, 2009 including the specification, drawings and abstract is incorporated herein by reference in its entirety.

BACKGROUND OF THE INVENTION

The present invention relates to an inter-module interface circuit within a semiconductor device or between a semiconductor device and an external circuit, and an interface circuit between different types of power source voltages of a semiconductor device operated by two or more power source voltages.

A pull-up circuit improves a margin of an input voltage level by fixing an input terminal to a desired level.

FIG. 1 illustrates a configuration of a bus-hold circuit, which is a typical pull-up circuit.

First, focusing on FIG. 1(a), an inverter 11 is inserted between an input terminal IN and an output terminal OUT. An output of the inverter 11 is branched and subsequently input to a MOSFET. If a first MOSFET 12 is a pMOSFET, the first MOSFET 12 is turned on when an "L" level voltage is applied. Here, the first MOSFET 12 is not limited to a pMOSFET and an nMOSFET can also be used.

If an "H" level voltage is applied to a gate terminal when the first MOSFET 12 is an nMOSFET (or, alternatively, if an "L" level voltage is applied when the first MOSFET 12 is a pMOSFET), the first MOSFET 12 is turned on.

An invention described in Japanese Patent Laid-Open No. 2008-21733 discloses a technology that enables high-speed operation by optimizing the thickness of a gate oxidation film when there is a circuit module using a plurality of power source voltages in a single semiconductor integrated circuit. When considering the thickness of a gate oxidation film, a bus-hold circuit of FIG. 1(a) is transformed such as shown in FIG. 1(b). That is, a input voltage-adjusting MOSFET 21 is inserted between the input terminal IN and the inverter 11. The "H" level of a signal input to the input terminal IN is lowered by a threshold voltage Vth of the input voltage-adjusting MOSFET 21 (Vcc−Vth), and thereby input potentials of the input terminal IN and the inverter 11 are separated to protect the gate oxide film of the internal circuit.

It is also conceivable, as shown in FIG. 1(c), to insert a NOR gate 31 instead of the inverter 11 to provide a control terminal CNT as an input terminal. This has an advantage that an output terminal OUT can be fixed regardless of the level of the input terminal IN by setting the control terminal CNT to "L".

SUMMARY OF THE INVENTION

There is however also a problem with the circuit of FIGS. 1(a) to 1(c).

For example, let us assume that the power source voltage Vcc and the "H" level voltage of the signal applied to the input terminal IN are both designed to be 3V. There is no problem if the signal applied to the input terminal IN is 3V. No leak current occurs because the input terminal IN and the power source voltage Vcc are both 3V when the first MOSFET 12 is conductive.

This is however not true if the "H" level voltage of the signal applied to the input terminal IN falls due to an error during manufacture or due to a circuit coupled to the input terminal IN. That is, when the "H" level voltage of the signal applied to the input terminal IN falls, a difference of potentials occurs between the input terminal IN and the power source voltage Vcc to generate a leak current. This may result in an increased power consumption of a semiconductor including the pull-up circuit and an electronic device including the semiconductor.

In addition, when a plurality of power source voltages such as those assumed in the aforementioned Japanese Patent Laid-Open No. 2008-21733 are included, it frequently happens that the voltage of the input terminal IN is higher than the power source voltage Vcc. Hence, measures to be taken for such an occasion must be considered from the beginning of the design.

The present invention has been made in view of the above circumstances and provides means that prevents generation of a leak current if a difference of potentials occurs between the power source voltage Vcc of a pull-up circuit (a bus-hold circuit) and the input terminal IN.

The other purposes and the new feature of the present invention will become clear from the description of the present specification and the accompanying drawings.

The following explains briefly the outline of some embodiments disclosed in the present application.

A first pull-up circuit according to a representative embodiment of the present invention includes an input terminal for receiving an input signal, a control terminal for receiving a control signal, a first MOSFET, a second MOSFET ("control MOSFET"), and a NOR gate for outputting an inverted logical sum of the input signal and the control signal, wherein the first MOSFET and the control MOSFET are coupled in series between the power source voltage and the input terminal, and an output of the NOR gate is input to a gate terminal of the first MOSFET and the control signal is input to a gate terminal of the control MOSFET, respectively.

In the pull-up circuit, an output of the NOR gate or an inverted output of the NOR gate may be used as an output of the pull-up circuit.

Another pull-up circuit according to a representative embodiment of the present invention includes an input terminal for receiving an input signal, a control terminal for receiving a control signal, a first MOSFET, a control MOSFET, two or more impedance-increasing MOSFETs, and a NOR gate for outputting an inverted logical sum of the input signal and the control signal, wherein the first MOSFET, the control MOSFET, and the two or more impedance-increasing MOSFETs are coupled in series between the power source voltage and the input terminal, and an output of the NOR gate is input to a gate terminal of the first MOSFET and a gate terminal of the two or more impedance-increasing MOSFETs. Meanwhile, the inverted signal of the control signal is input to a gate terminal of the control MOSFET.

Another pull-up circuit according to a representative embodiment of the present invention includes an input terminal for receiving an input signal, a control terminal for receiving a control signal, a first MOSFET, a control MOSFET, and an inverter for outputting an inverted signal of the input signal, wherein the first MOSFET and the control MOSFET are coupled in series between the power source voltage and the input terminal, and an inverted signal of the output of the inverter is input to a gate terminal of the first MOSFET and an inverted signal of the control signal is input to a gate terminal of the control MOSFET, respectively.

In the pull-up circuit, an output of the inverter may be used as an output of the pull-up circuit.

A method of controlling a pull-up circuit according to a representative embodiment of the present invention relates to a pull-up circuit including an input terminal for receiving an input signal, a power-source terminal for supplying a power source voltage, a bus-holding MOSFET electrically coupled between the power-source terminal and the input terminal and receiving a signal depending on the input signal at a gate terminal thereof, and a control MOSFET electrically coupled between the power-source terminal and the input terminal, the method including a step of decoupling conduction between the source and drain of the control MOSFET to prevent a current from flowing from the power-source terminal to the input terminal.

The following explains briefly the effect acquired by the typical invention among the inventions disclosed in the present application.

Characteristics of a semiconductor device can be improved according to a representative embodiment of the present invention. In particular, generation of a leak current can be prevented in a semiconductor device using a pull-up circuit.

DETAILED DESCRIPTION OF THE PREFERRED EMBODIMENTS

Embodiments of the invention will be described below, referring to accompanying drawings. Although the input voltage-adjusting MOSFET 21 of FIG. 1(b) is omitted in the following drawings, it may be inserted as appropriate depending on the purpose of usage.

Figures 2, 3:
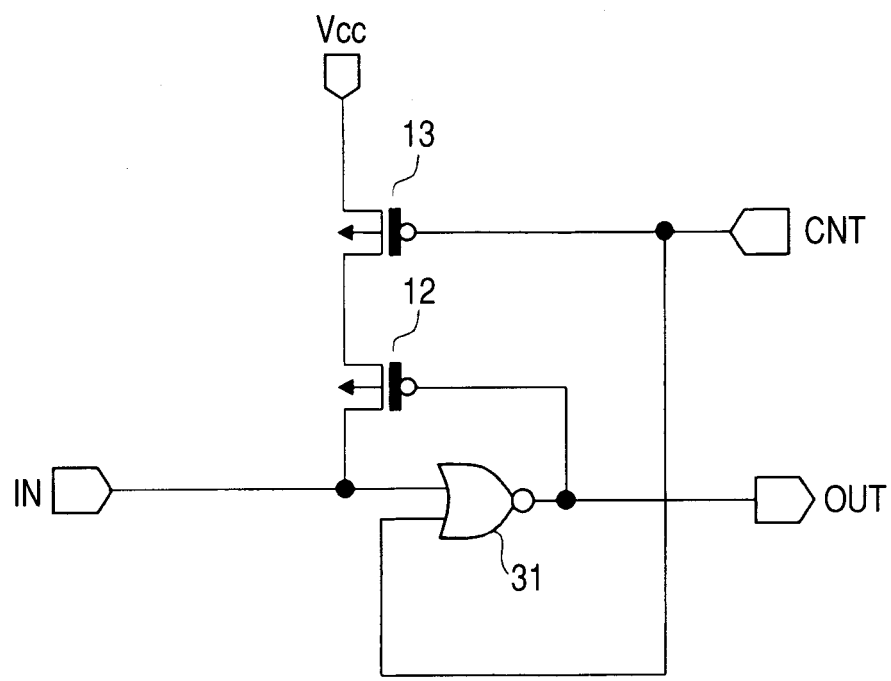
FIG. 2 is a circuit diagram of a pull-up circuit according to a first embodiment of the present invention.
FIG. 3 is a truth table representing an operation of the pull-up circuit of FIG. 2.

FIG. 2 is a circuit diagram of a pull-up circuit according to the first embodiment of the present invention.

Figure 1A:
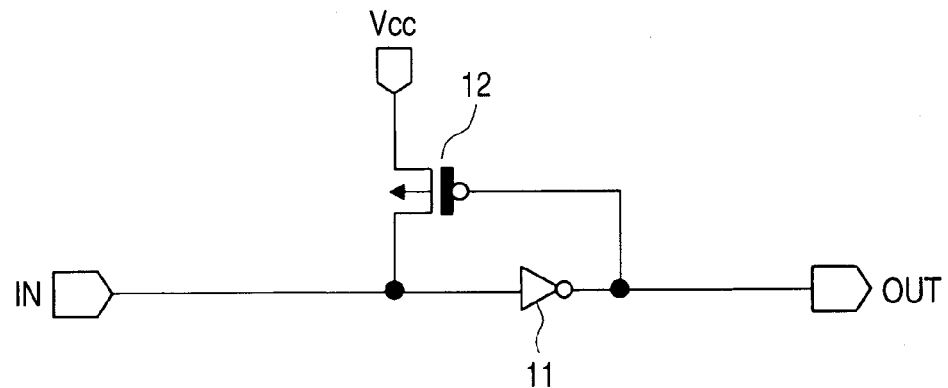
FIGS. 1(a) to 1(c) are diagrams illustrating a configuration of a bus-hold circuit which is a typical pull-up circuit.
Figure 1B:
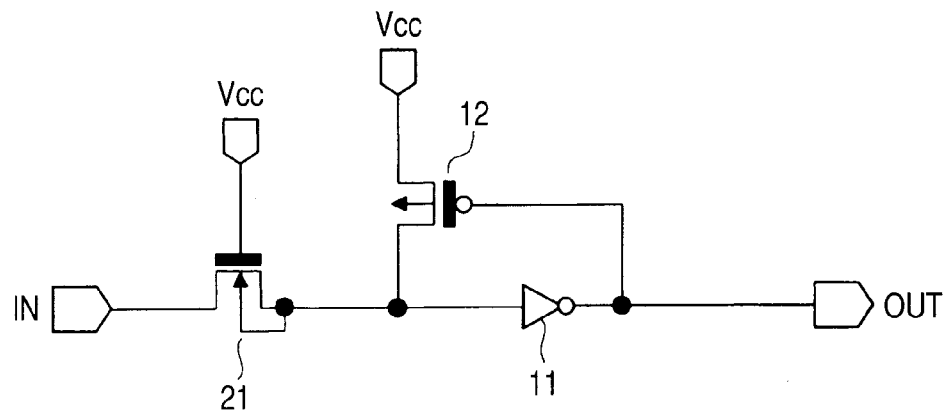
Figure 1C:
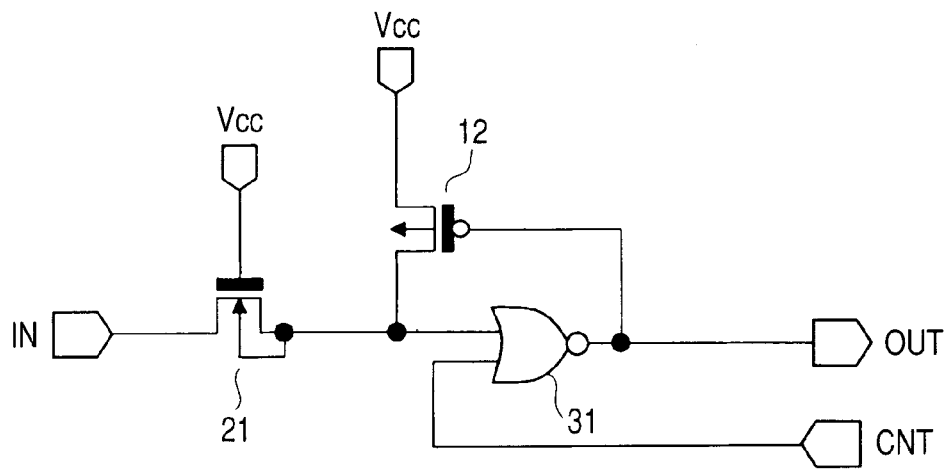

The circuit has been devised based on FIG. 1(c). A second MOSFET 13 (referred to herein as "control MOSFET") is further added to the circuit of FIG. 1(c).

The control MOSFET 13 works as a switch used for controlling conductivity between the power source voltage Vcc and the input terminal IN.

The source and drain of the control MOSFET 13 are coupled in series between the first MOSFET 12 and the power source voltage Vcc (when the control MOSFET 13 is an nMOSFET, the input of the control terminal CNT is inverted and input to the gate terminal).

With such a configuration, the control terminal CNT works as an enable signal of the output terminal OUT similarly to FIG. 1(c). The control terminal CNT is in an enabled state at the "L" level, in which state the signal applied to the input terminal IN is transmitted to the output terminal OUT.

On the other hand, the difference from FIG. 1(c) lies in that the control MOSFET 13 is provided in FIG. 2. Turning ON/OFF the power source voltage Vcc is controlled by the control MOSFET 13. That is, the control MOSFET 13 is turned on when the control terminal CNT is at the "L" level, whereas the control MOSFET 13 is turned OFF when the control terminal CNT is at the "H" level.

FIG. 3 is a truth table representing an operation of the pull-up circuit of FIG. 2. As can be seen, the output terminal OUT remains at the "L" level as long as the control terminal CNT is at the "H" level. If, on the other hand, the control terminal CNT falls to the "L" level, the output terminal OUT also varies according to the level of the input terminal IN similarly to FIG. 1(c). As a result, the power source voltage Vcc and the input terminal IN are made conductive only when the control terminal CNT is at the "L" level and the input terminal IN is at the "H" level.

Figure 4:
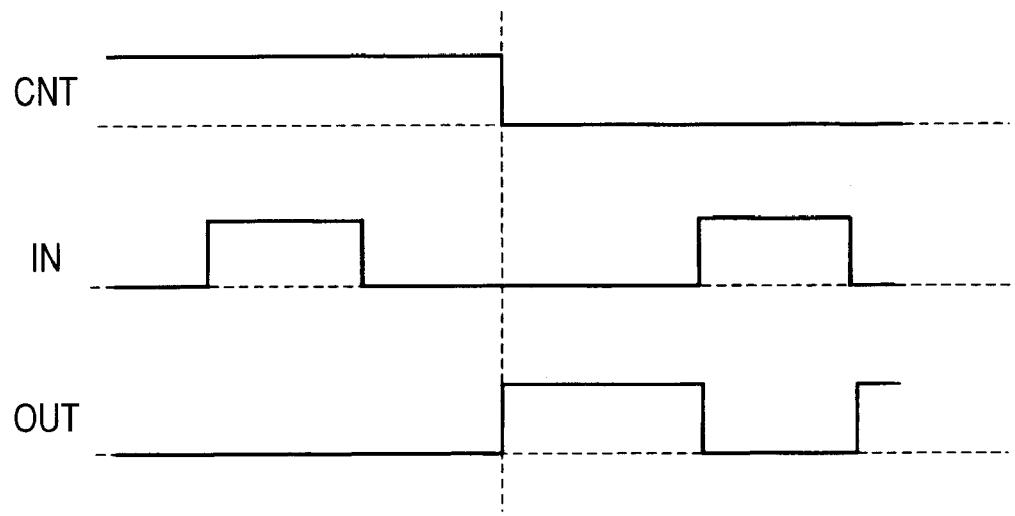
FIG. 4 is a waveform chart representing an operation of the pull-up circuit of FIG. 2.

FIG. 4 is a waveform chart representing an operation of the pull-up circuit of FIG. 2. As can be seen in the waveform chart, the waveform input to the input terminal IN is not reflected to the output terminal OUT as long as the control terminal CNT is at the "H" level. If, on the other hand, the control terminal CNT is at the "L" level, the waveform input to the input terminal IN is inverted and output from the output terminal OUT.

An effect of the pull-up circuit according to the first embodiment of the invention will be described below.

Figure 5:
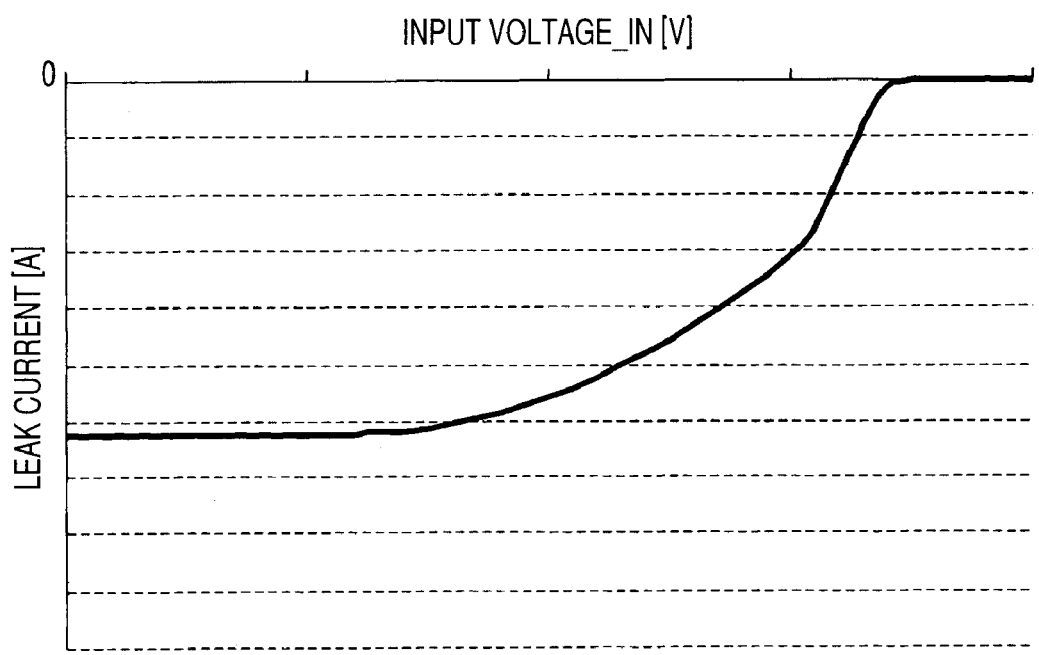
FIG. 5 is a graph showing an amount of a leak current of a conventional bus-hold circuit according to FIG. 1(c)
Figure 6:
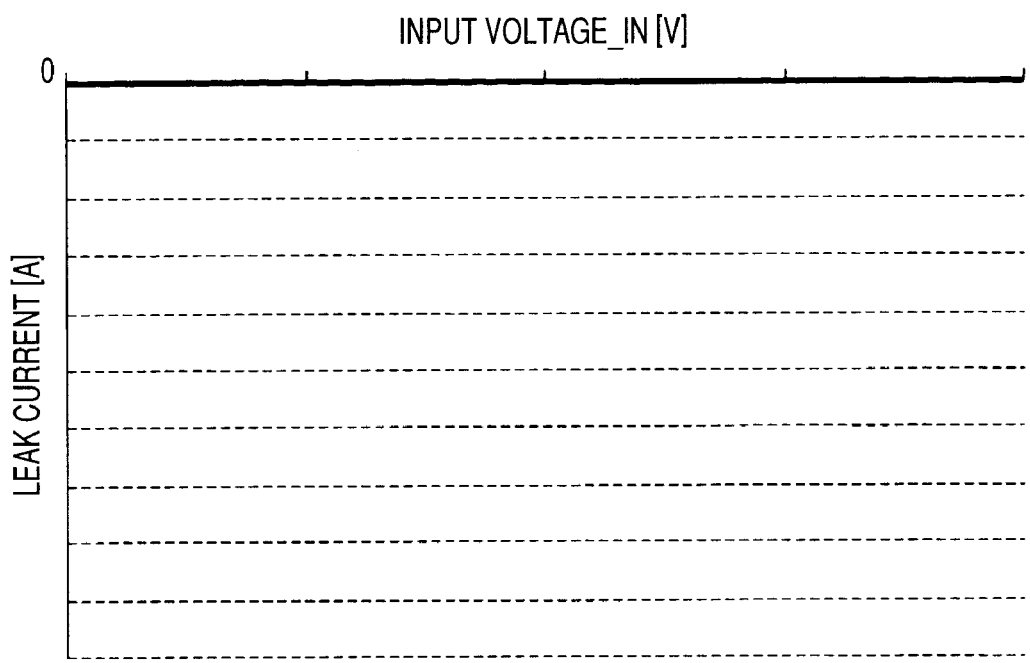
FIG. 6 is a graph showing an amount of a leak current of a pull-up circuit according to the first embodiment of the present invention when the control terminal is at an "H" level.
Figure 7:
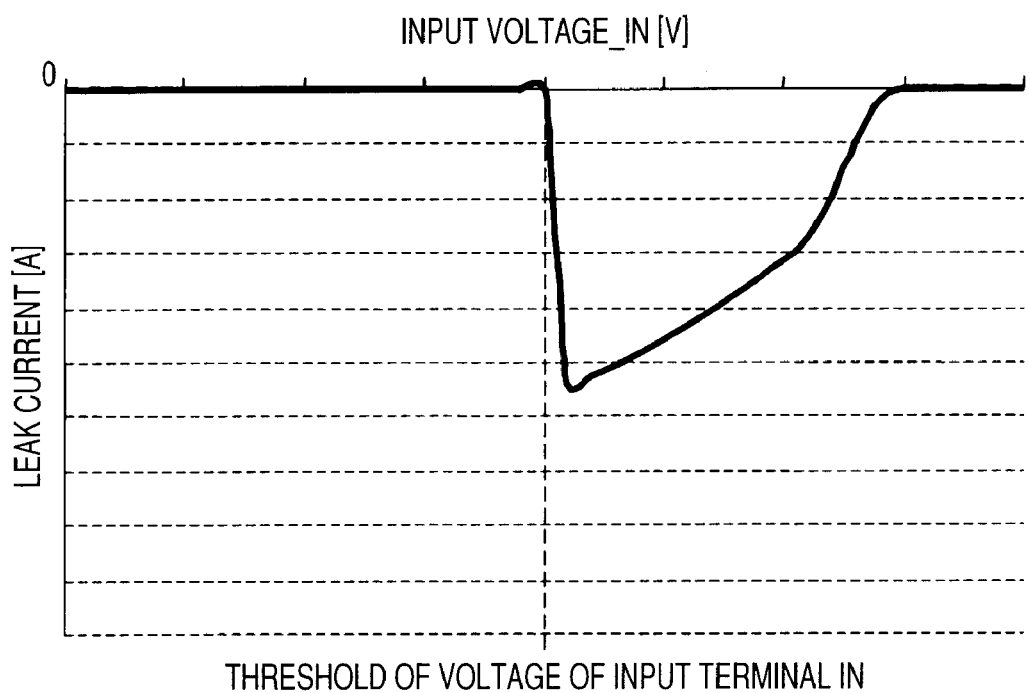
FIG. 7 is a graph showing an amount of a leak current of a pull-up circuit according to the first embodiment of the present invention when the control terminal is at an "L" level.

FIG. 5 shows the amount of leak current of a conventional bus-hold circuit according to FIG. 1(c). In addition, FIG. 6 shows the amount of leak current of the pull-up circuit according to the first embodiment of the invention when the control terminal CNT is at the "H" level, and FIG. 7 shows the amount of leak current of the pull-up circuit according to the first embodiment of the invention when the control terminal CNT is at the "L" level. In any of these figures, the horizontal axis represents the input voltage applied to the input terminal IN and the vertical axis represents the amount of leak current.

As can be seen in FIG. 5, a leak current is generated in a conventional bus-hold circuit from the rise of an input voltage applied to the input terminal IN, and the leak current decreases as the input voltage applied to the input terminal IN approaches the power source voltage Vcc. The leak current however never becomes zero if the "H" level of the input voltage applied to the input terminal IN is smaller than the power source voltage Vcc.

With the embodiment of the invention, the leak current can be completely suppressed when the control terminal CNT is at the "H" level (see FIG. 6).

In addition, even if the control terminal CNT is at the "L" level (FIG. 7) generation of a leak current can be prevented as long as the input voltage applied to the input terminal IN does not rise to the "H" level. When the input voltage applied to the input terminal IN exceeds an "H" level threshold value, a leak current is generated which is similar, if not identical, to the leak current of the conventional pull-up circuit. In other words, generation of a leak current can be prevented until the input voltage applied to the input terminal IN exceeds the "H" level threshold value.

Having taken such measures, generation of a leak current between the power source voltage Vcc and the input terminal IN can be prevented.

Figure 8A:
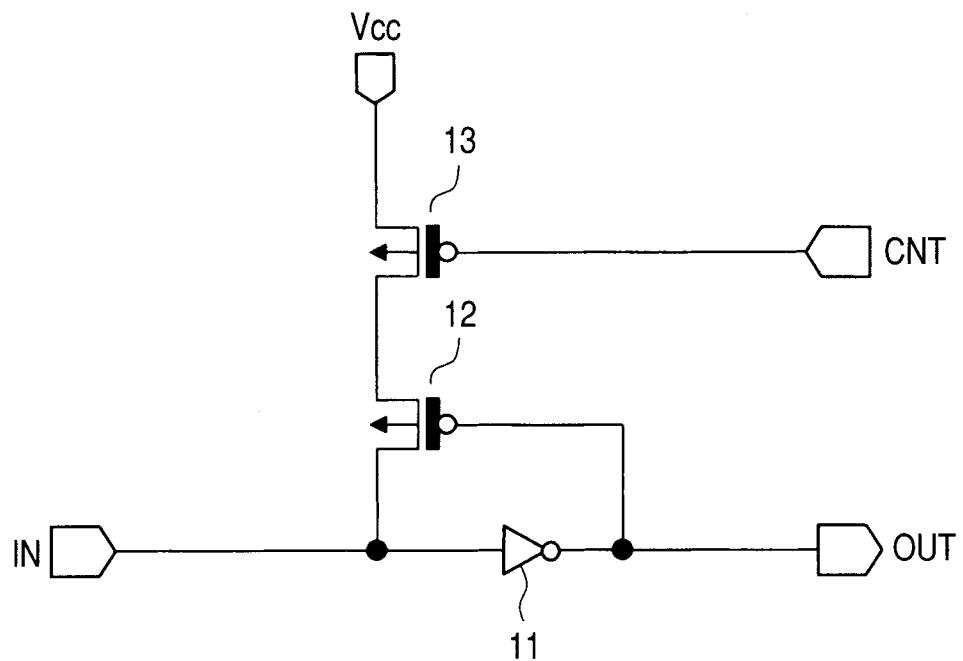
FIGS. 8(a) and 8(b) are circuit diagrams of another pull-up circuit according to the first embodiment of the present invention.
Figure 8B:
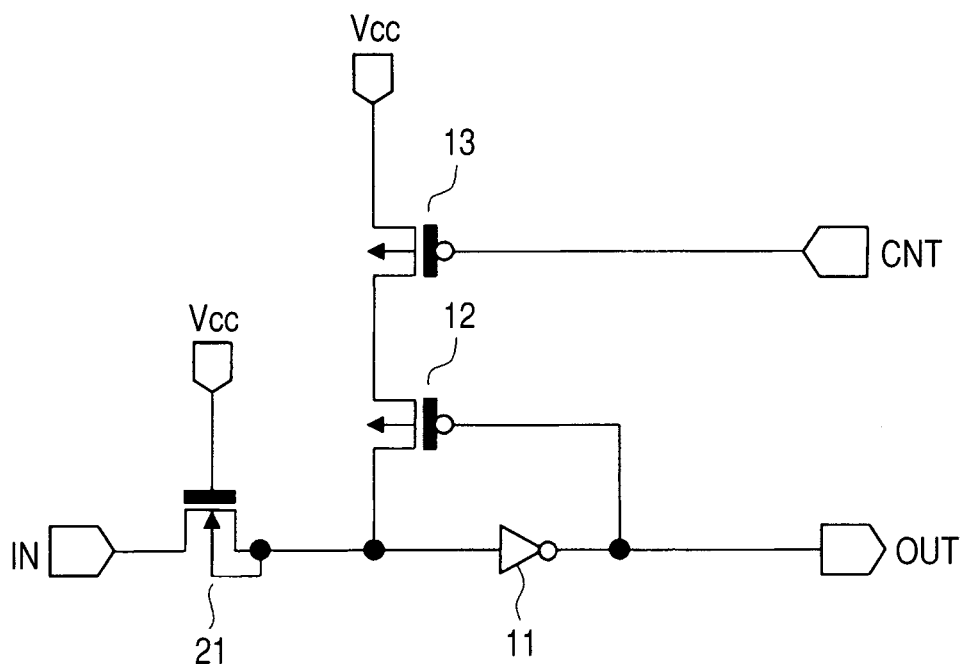

Exemplary modifications of the above circuit include the circuits shown in each of FIGS. 8(*a*) and 8(*b*). FIGS. 8(*a*) and 8(*b*) are circuit diagrams of another pull-up circuit according to the first embodiment of the invention.

The circuit of FIG. 8(*a*) is similar to the circuit seen in FIG. 1(*a*), but has an additional control terminal in form of control MOSFET 13. Similarly, the circuit of FIG. 8(*b*) is similar to the circuit seen in FIG. 1(*b*), but has an additional control terminal in form of control MOSFET 13. In a case where the NOR gate 31 of FIG. 2 does not exist, the control terminal CNT is coupled only to the control MOSFET 13, as with these circuits of FIGS. 8(*a*) and 8(*b*).

Regardless of the above modification, exemplary modifications as a matter of design for implementation are also included in the scope of the invention. In FIG. 2, for example, the output of the NOR gate 31 is directly used as the output of the pull-up circuit (i.e., the inverted signal of the input signal). Modifications such as inverting the output of the NOR gate 31 by the inverter and subsequently using it as the output of a pull-up circuit may however be considered, as a matter of course.

A second embodiment of the present invention will be described next.

Figure 9:
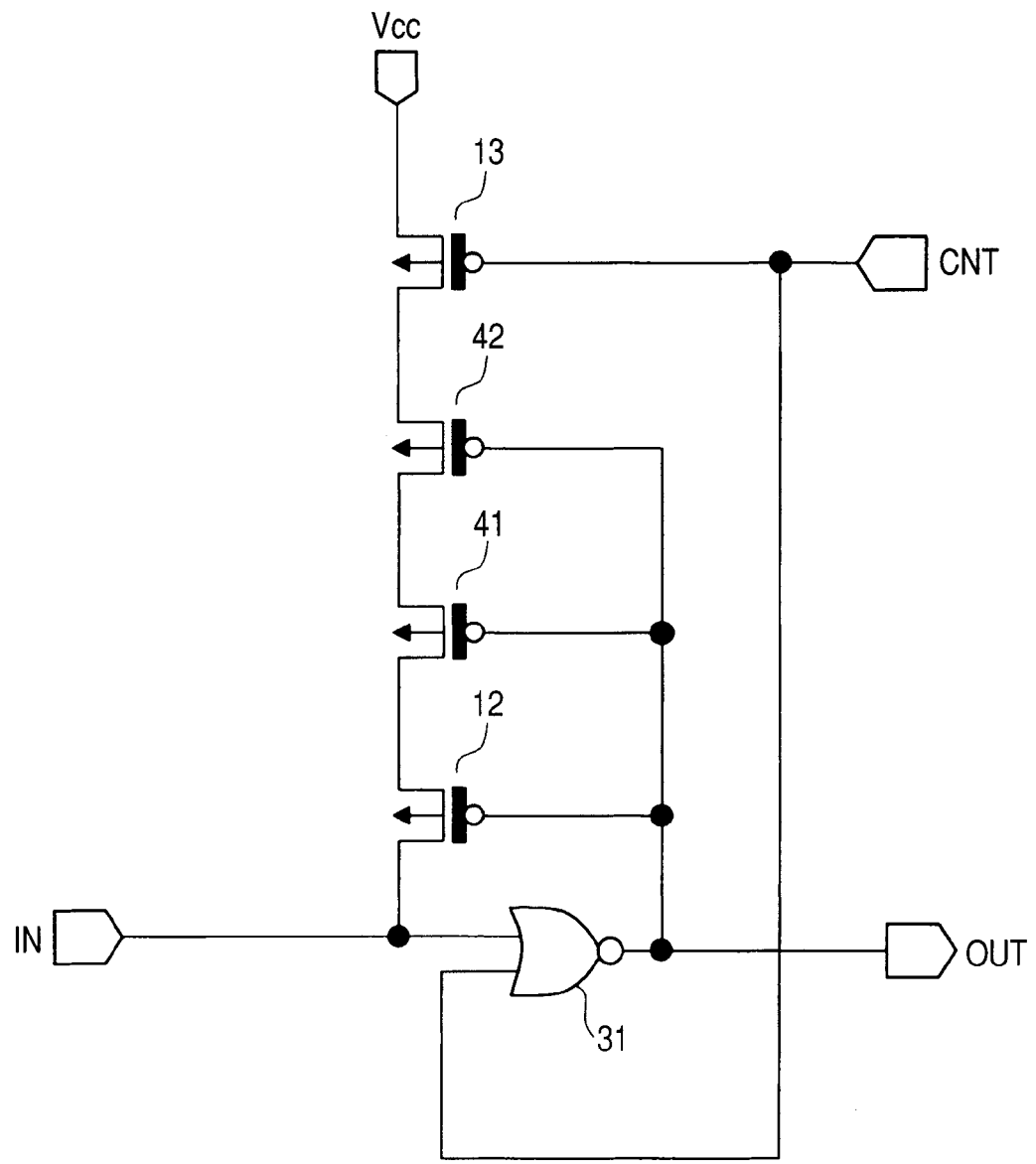
FIG. 9 is a circuit diagram of a pull-up circuit according to a second embodiment of the present invention.

FIG. 9 is a circuit diagram of a pull-up circuit according to the second embodiment of the invention.

The pull-up circuit further has a third MOSFET 41 and a fourth MOSFET 42 inserted and coupled in series between the first MOSFET 12 and the control MOSFET 13.

The third MOSFET 41 and the fourth MOSFET 42 are similar to the first MOSFET 12 in that each of them respectively functions as a switch. The output of the NOR gate 31 is inverted and coupled to the gate terminals of the third MOSFET 41 and the fourth MOSFET 42, as to the first MOSFET 12 (when the third MOSFET 41 and the fourth MOSFET 42 are composed of a nMOS, the output of the NOR gate 31 is directly input).

With the above configuration, the impedance between the power source voltage Vcc and the input terminal IN can be increased. By raising the impedance, the leak current during a normal operation can be reduced. That is, the absolute amount of leak current of FIG. 7 can be reduced.

Although two impedance MOSFETs are added in the configuration of the second embodiment, the number is not essential and it suffices as long as a required impedance is secured.

An exemplary application 1 of the above two embodiments will be described next.

Figure 10:
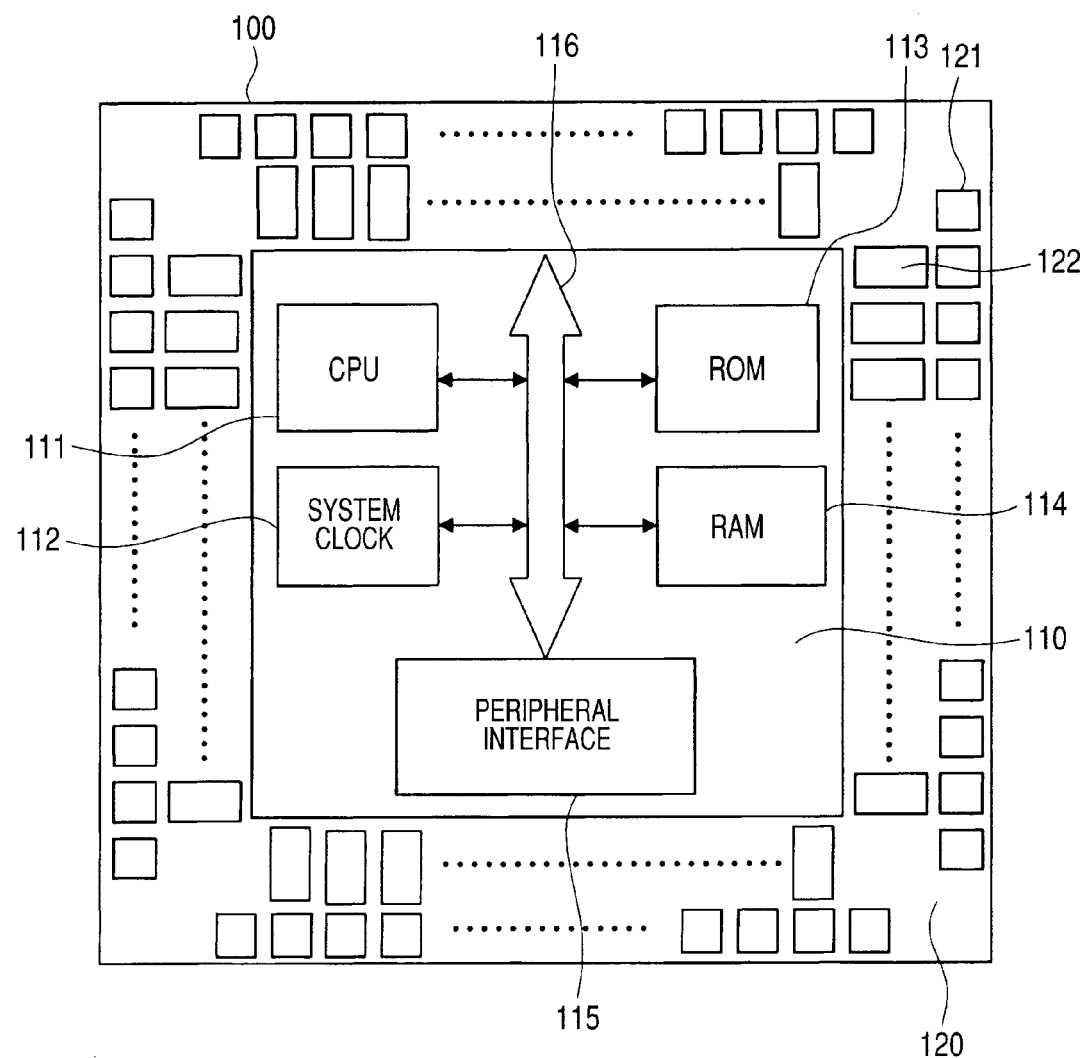
FIG. 10 is a conceptual diagram of a semiconductor device applying a pull-up circuit according to the present invention.

The exemplary application 1 describes where in the semiconductor device the pull-up circuit of the first and second embodiments is applied. FIG. 10 is a conceptual diagram of a semiconductor device 100 applying a pull-up circuit according to the invention.

The semiconductor device 100 can be generally divided into an inner region 110 and an outer region 120.

The inner region 110 includes basic components for performing processing by the semiconductor device 100. That is, the inner region 110 comprises a CPU 111, a system clock 112, a ROM 113, a RAM 114, a peripheral interface 115, and an internal bus 116.

The CPU 111 is a central processor that performs the main control of the semiconductor device.

The system clock 112 is a frequency divider or multiplier that generates a reference operation clock.

The ROM 113 is a read only memory capable of continuously storing even in the event of power shutdown. On the other hand, the RAM 114 is a Random Access Memory for temporarily storing a program to be executed.

The peripheral interface 115 is an interface circuit that provides an interface with a circuit outside the semiconductor device 100.

The internal bus 116 is a common path for exchanging data between modules such as the CPU 111 included in the inner region 110.

There are a plurality of bonding pads 121 and input-output circuit blocks 122 to be input terminals in the outer region 120.

The bonding pad 121 is a physical and electric coupling point on which solder paste is coated when the semiconductor device 100 is mounted on a substrate or the like (not shown).

The input-output circuit block 122 transfers or temporarily stores transmission/reception data as a so-called input-output buffer.

Usually, the power source voltages are different in the inner region 110 and the outer region 120. In many cases, the outer region 120 has a voltage of 3.3V and the inner region 110 has a voltage of 1.5V, for example. Due to the difference of the power source voltages, the gate oxide films of the transistor have different thicknesses. In the above case, the outer region 120 has a thickness of about 7 nm and the inner region 110 has a thickness of about 3 nm.

Figure 11:
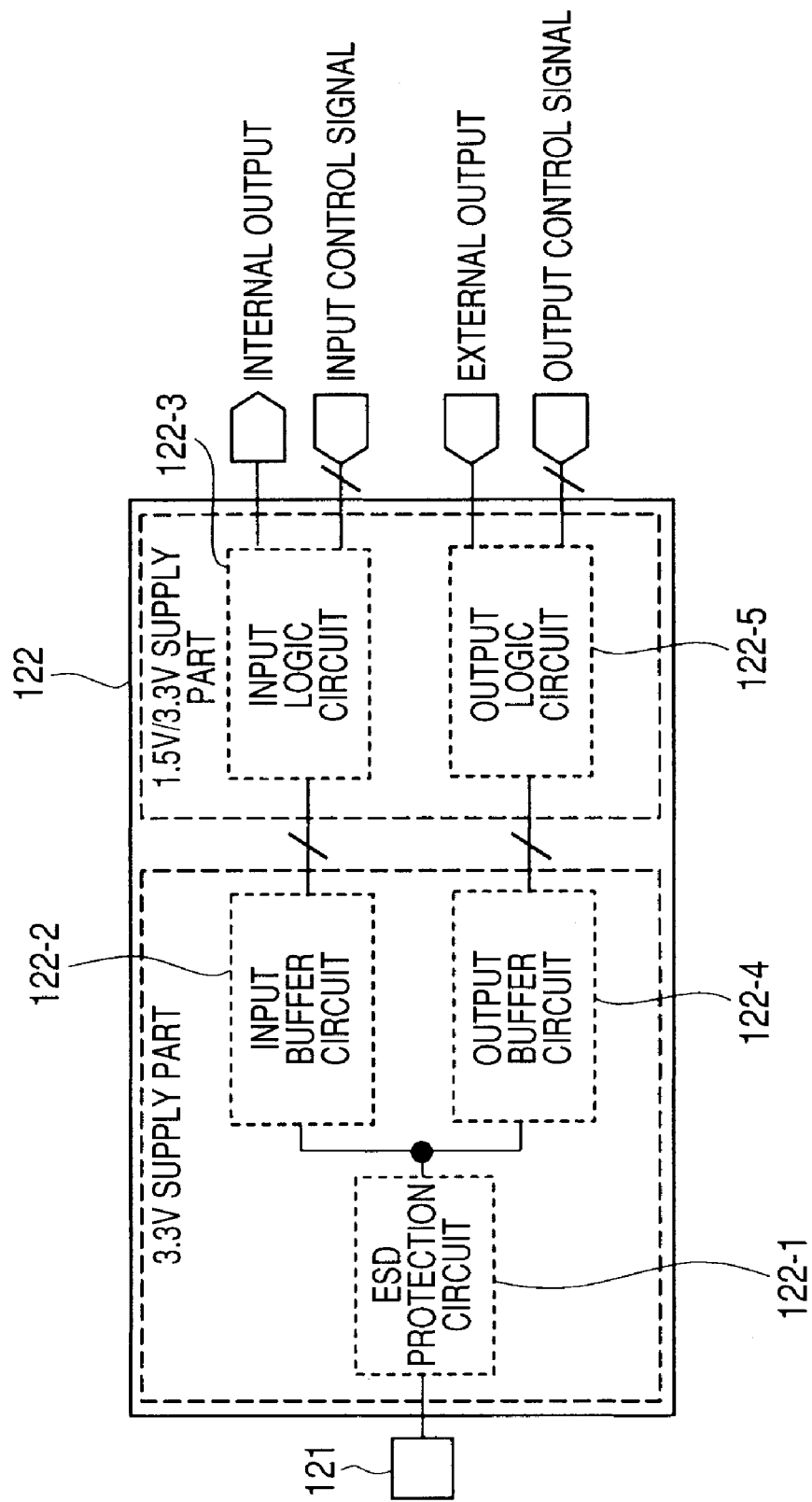
FIG. 11 is a circuit diagram representing a configuration of an input-output circuit block of FIG. 10.

A pull-up circuit according to the invention is used in a circuit, i.e., an input-output circuit block 122, located at the border between the outer region 120 and the inner region 110. FIG. 11 is a circuit diagram representing a configuration of the input-output circuit block 122 of FIG. 10.

The input-output circuit block 122 includes an ESD protection circuit 122-1, an input buffer circuit 122-2, an input logic circuit 122-3, an output buffer circuit 122-4, and an output logic circuit 122-5. Among these, the ESD protection circuit 122-1, the input buffer circuit 122-2, and the output buffer circuit 122-4 are driven by the 3.3V power source voltage of the outer region 120. On the other hand, the input logic circuit 122-3 and the output logic circuit 122-5 are driven by the 1.5V or 3.3V power source voltage of the inner region 110.

The ESD protection circuit 122-1 absorbs overvoltage to prevent the device from being damaged by electrostatic discharge (ESD).

The input buffer circuit 122-2 transfers or temporarily latches information sent from the ESD protection circuit 122-1 and transmits it to the input logic circuit 122-3.

An object of the pull-up circuit according to the invention is to prevent generation of a leak current due to the voltage of the input edge being lower than the power source voltage. Hence, the pull-up circuit according to the invention can be applied to the input buffer circuit 122-2. The reason of this is because the voltage of the outer region 120 is 3.3V and the voltage of the inner region 110 is 1.5V, both satisfying the condition.

The input logic circuit 122-3 outputs data accumulated in the input buffer circuit 122-2 to the peripheral interface 115 of the inner region 110. The input logic circuit 122-3 includes an internal output terminal for outputting the data to the peripheral interface 115 of the inner region 110 and an input control signal terminal for receiving a control signal from the peripheral interface 115 of the inner region 110.

Contrary to the input buffer circuit 122-2, the output buffer circuit 122-4 outputs data from the inner region 110 to the bonding pad 121. Because the input voltage is higher in this case and thus generation of a leak current is limited to a temporary phenomenon during transition, there is little room for applying the pull-up circuit according to the invention.

The output logic circuit 122-5 converts the format of data sent from the peripheral interface 115 of the inner region 110.

Although an exemplary application of the pull-up circuit according to the invention has been described in the foregoing, it is not intended to be limiting. In addition, two types of power source voltages, 3.3 V and 1.5 V, have been explained in the above description. The number of types of power source voltages is however not limited thereto, and there may be three or more types of voltages. In addition, voltages other than 3.3 V and 1.5 may also be used.

An application 2 will be described next.

As has been stated above, it is assumed so far in this specification that all the MOSFETs are pMOS devices. A semiconductor device however usually comprises nMOS and pMOS devices in a mixed manner (CMOS). A case where the circuit comprises CMOS devices will be described below.

Figure 12:
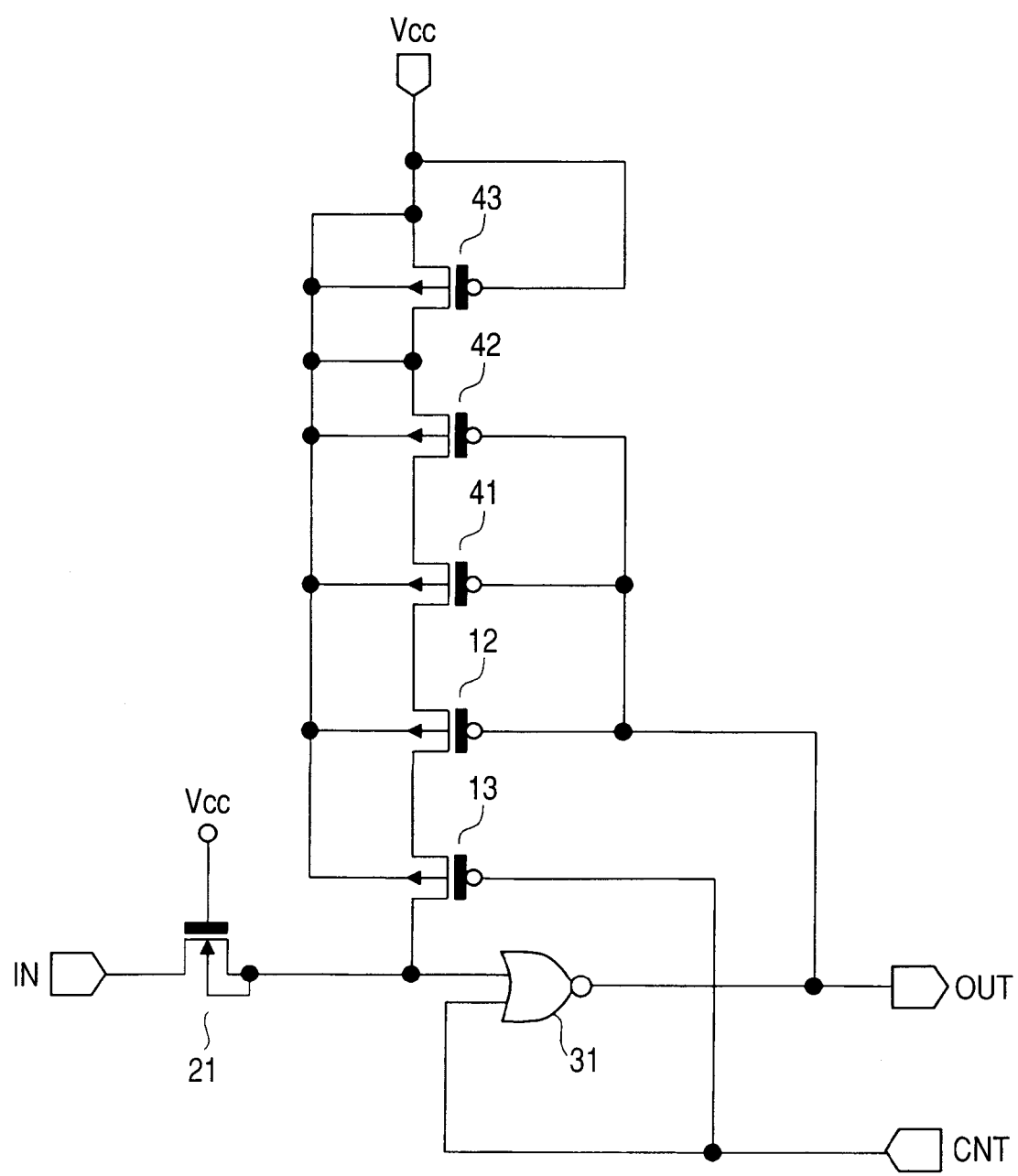
FIG. 12 is a circuit diagram of a pull-up circuit which is a transformation of the pull-up circuit of FIG. 9.

FIG. 12 is a circuit diagram of a pull-up circuit that is a modification of the pull-up circuit of FIG. 9. The difference between the pull-up circuit of FIG. 12 and the pull-up circuit of FIG. 9 lies in that a voltage lowering MOSFET 43 for lowering the voltage Vcc is inserted in the series. In addition, the first MOSFET 13 is moved to the side of input terminal IN (although there is no technical meaning).

Now, consideration is provided to mount the pull-up circuit of FIG. 12 on an actual semiconductor circuit.

Figure 13:
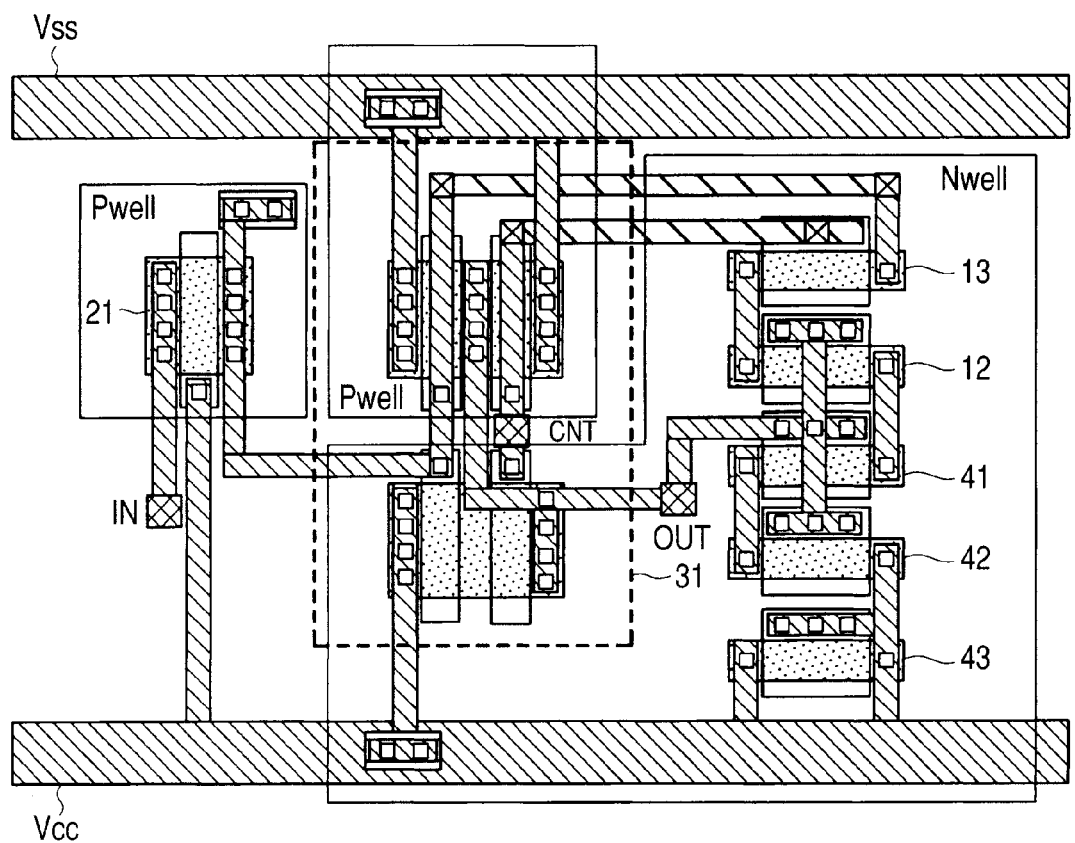
FIG. 13 is a planar perspective view of main parts when the pull-up circuit of FIG. 12 is mounted on a substrate of an actual semiconductor circuit.

FIG. 13 is a planar perspective view of main parts when the pull-up circuit of FIG. 12 is mounted on a substrate of an actual semiconductor circuit. FIG. 13 represents a pull-up circuit formed on a substrate by repeatedly etching, forming an insulating film, etching, and so on. In practice, the insulating film layer or the like are expressed as transparent.

As can be seen in FIG. 13, MOSFETs 43, 42, 41, 12 and 13 are serially arranged on an Nwell in this order in an actual implementation.

The NOR gate 31 is disposed in a straddling manner over the Nwell and a Pwell. By further disposing the input voltage-adjusting MOSFET 21 on the Pwell, the circuit of FIG. 12 can be formed.

Although the invention made by the inventors has been specifically described based on the embodiments, it is needless to say that the invention is not limited to the embodiments and various modifications are possible without deviating from the scope thereof.

What is claimed is:

1. A semiconductor device including a pull-up circuit, the semiconductor device comprising:
an input terminal for receiving an input signal;
a control terminal for receiving a control signal;
a first MOSFET;
a control MOSFET; and
a NOR gate for outputting an inverted logical sum of the input signal and the control signal, wherein:
the first MOSFET and the control MOSFET are coupled in series between a power source voltage and the input terminal, and the input terminal is coupled to a source or drain of one of the MOSFETs;
an output of the NOR gate is input to a gate terminal of the first MOSFET; and
the control signal is input to a gate terminal of the control MOSFET.

2. The semiconductor device according to claim 1, wherein all MOSFETs are p-channel MOSFETs.

3. The semiconductor device according to claim 2, further comprising:
a voltage-adjusting MOSFET used for adjusting a voltage of the input signal electrically coupled immediately after the input terminal.

4. The semiconductor device according to claim 1, further comprising:
a voltage-adjusting MOSFET used for adjusting a voltage of the input signal electrically coupled immediately after the input terminal.

5. The semiconductor device according to claim 1:
wherein the first MOSFET and the control MOSFET are p-channel MOSFETs.

6. The semiconductor device according to claim 1, wherein:
the first MOSFET and the control MOSFET are coupled in series between the power source and an input node to the NOR Gate.

7. A semiconductor device including a pull-up circuit, the semiconductor device comprising:
an input terminal for receiving an input signal;
a control terminal for receiving a control signal;
a first MOSFET;
a control MOSFET; and
a NOR gate for outputting an inverted logical sum of the input signal and the control signal, wherein:
the first MOSFET and the control MOSFET are coupled in series between a power source voltage and the input terminal;
an output of the NOR gate is input to a gate terminal of the first MOSFET; and
the control signal is input to a gate terminal of the control MOSFET; wherein
the output of the NOR gate or the inverted output of the NOR gate is used as an output of the pull-up circuit.

8. The semiconductor device according to claim 2, further comprising:
a voltage-adjusting MOSFET used for adjusting a voltage of the input signal electrically coupled immediately after the input terminal.

9. The semiconductor device according to claim 7, wherein:
the input terminal is coupled to a source or drain of one of the MOSFETs.

10. The semiconductor device according to claim 7, wherein:
the first MOSFET and the control MOSFET are coupled in series between the power source and an input node to the NOR Gate.

11. A semiconductor device comprising:
an input terminal for receiving an input signal;
a control terminal for receiving a control signal;
a first MOSFET;
a control MOSFET;
two or more impedance-increasing MOSFETs; and
a NOR gate for outputting an inverted logical sum of the input signal and the control signal, wherein:
the first MOSFET, the control MOSFET and the two or more impedance-increasing MOSFETs are coupled in series between a power source voltage and the input terminal, and the input terminal is coupled to a source or drain of one of the MOSFETs;

an output of the NOR gate is input to a gate terminal of the first MOSFET and also to gate terminals of the two or more impedance-increasing MOSFETs; and the control signal is input to a gate terminal of the control MOSFET.

12. The semiconductor device according to claim 11, wherein all MOSFETs are p-channel MOSFETs.

13. The semiconductor device according to claim 12, further comprising:

a voltage-adjusting MOSFET used for adjusting a voltage of the input signal electrically coupled immediately after the input terminal.

14. The semiconductor device according to claim 11, further comprising:

a voltage-adjusting MOSFET used for adjusting a voltage of the input signal electrically coupled immediately after the input terminal.

15. The semiconductor device according to claim 11, wherein:

the first MOSFET and the control MOSFET are coupled in series between the power source and an input node to the NOR Gate.

16. A semiconductor device comprising:

an input terminal for receiving an input signal;
a control terminal for receiving a control signal;
a first MOSFET;
a control MOSFET;
two or more impedance-increasing MOSFETs;
a voltage lowering MOSFET; and
a NOR gate for outputting an inverted logical sum of the input signal and the control signal, wherein:

the first MOSFET, the control MOSFET the two or more impedance-increasing MOSFETs and the voltage-lowering MOSFET are coupled in series between a power source voltage and the input terminal;

an output of the NOR gate is input to a gate terminal of the first MOSFET and also to gate terminals of the two or more impedance-increasing MOSFETs;

the control signal is input to a gate terminal of the control MOSFET; and neither the output of the NOR gate, nor the control signal, is input to a gate of the voltage lowering MOSFET.

17. The semiconductor device according to claim 16, further comprising:

a voltage-adjusting MOSFET used for adjusting a voltage of the input signal electrically coupled immediately after the input terminal.

18. The semiconductor device according to claim 16, wherein:

the input terminal is coupled to a source or drain of one of the MOSFETs.

19. The semiconductor device according to claim 16, wherein:

the first MOSFET and the control MOSFET are coupled in series between the power source and an input node to the NOR Gate.

20. A method of controlling a semiconductor device including a pull-up circuit, the pull-up circuit having an input terminal for receiving an input signal, a power-source terminal for supplying a power source voltage, a bus-holding MOSFET receiving a signal depending on the input signal at a gate terminal thereof, and a control MOSFET receiving a control signal at a gate terminal thereof, wherein the bus-holding MOSFET and the control MOSFET are electrically coupled in series between the power-source terminal and the input terminal, and the input terminal is coupled to a source or drain of one of the MOSFETs, the method comprising the steps of:

decoupling conduction between the source and drain of the control MOSFET to prevent a current from flowing from the power-source terminal to the input terminal; and presenting the same signal received by the bus-holding MOSFET, or an inverted version thereof, as an output signal of the pull-up circuit.

* * * * *